United States Patent [19]

Takai

[11] Patent Number: 5,005,156
[45] Date of Patent: Apr. 2, 1991

[54] SEMICONDUCTOR DEVICE HAVING OUTPUT BUFFER CIRCUIT CONTROLLED BY OUTPUT CONTROL SIGNAL

[75] Inventor: Yasuhiro Takai, Tokyo, Japan

[73] Assignee: NEC Corporation, Tokyo, Japan

[21] Appl. No.: 457,631

[22] Filed: Dec. 27, 1989

[30] Foreign Application Priority Data

Dec. 27, 1988 [JP] Japan .............................. 63-331724

[51] Int. Cl.⁵ .............................................. G11C 11/34
[52] U.S. Cl. ................................. 365/189.05; 365/206
[58] Field of Search .................... 365/189.05, 189.07, 365/189.11, 194, 195, 206, 233.5

[56] References Cited
FOREIGN PATENT DOCUMENTS
285296 12/1987 Japan .............................. 365/189.05

Primary Examiner—Joseph A. Popek
Attorney, Agent, or Firm—Sughrue, Mion, Zinn Macpeak & Seas

[57] ABSTRACT

In a semiconductor circuit device having a data output buffer circuit for driving an external circuit under the control of an output control signal, the device comprises an output detecting circuit for detecting the level changes in the data signal which is inputted to the data output buffer circuit. The output detecting circuit may also detect the level changes in the output control signal. The device further comprises a holding circuit for holding the output level of other related input circuits, for example an external signal input circuit, based on the detection of the level changes by the output detecting circuit, whereby possible output noises attendant on the data outputting operation of the data output buffer circuit are prevented from affecting the operation of the other related input circuits.

11 Claims, 5 Drawing Sheets

5,005,156

SEMICONDUCTOR DEVICE HAVING OUTPUT BUFFER CIRCUIT CONTROLLED BY OUTPUT CONTROL SIGNAL

BACKGROUND OF THE INVENTION

1. Field of the Invention

The present invention relates to a semiconductor device and, more particularly, to a semiconductor device having a data output buffer circuit controlled by an output control signal, in which output noises attendant on data outputting operation of the data output buffer circuit do not affect the operation of other related input circuits.

2. Description of Related Art

Conventionally, for driving an external circuit, a semiconductor device of the type to which the present invention relates utilizes MOS field effect transistors (hereinafter referred to as "FET"s) in a data output buffer circuit. The data output buffer circuit also comprises an inverter, a NAND gate and a NOR gate. The data which is read out from an internal storage cell in the semiconductor device and amplified is outputted to the external circuit under the control of an output control signal. Such a conventional semiconductor device suffers from a problem such that, when the data is outputted, a transitional change (hereinafter referred to as an "output noise") in the power supply potential or the ground potential is unavoidably transmitted to other related circuits constituting the semiconductor device. Transmission of such an output noise occurs because a power supply line and a ground line connected to the data output buffer circuit are respectively in common with a power supply line and a ground line for other related circuits such as an external signal input circuit. This was a defect in the device since such an output noise had to cause changes in the input threshold voltage. An example of such a problem is that the logical level of the external input signal was inverted due to the influence of the output noise on the circuit.

SUMMARY OF THE INVENTION

It is an object of the present invention to provide an improved semiconductor device having an output buffer circuit for driving an external circuit under the control of an output control signal.

It is another object of the present invention to provide a semiconductor device in which a data output buffer circuit controlled by an output control signal is provided and in which output noises, occurring at the time when a data is outputted from the data output buffer circuit, do not affect the operation of other related input circuits in the semiconductor device.

According to the present invention, a semiconductor device having a data output buffer circuit controlled by an output control signal is characterized in that the device has an output detecting circuit for detecting the level changes in the data signal inputted in the data output buffer circuit and a holding circuit for holding, based on the detection of the level changes in the data signal by the output detecting circuit, an output level of an input circuit constituting the semiconductor device.

Further, as an embodiment of the present invention, the semiconductor device may comprise an output detecting circuit which detects not only the level changes in the data signal inputted in the data output buffer circuit but also the level changes in the output control signal and, based on the detection of such level changes, the holding circuit may hold the output level of the input circuit.

BRIEF DESCRIPTION OF THE DRAWINGS

The foregoing and other objects are effected by the invention as will be apparent from the following description and claims taken in connection with the accompanying drawings, forming a part of this application, in which:

PREFERRED EMBODIMENTS OF THE INVENTION

Figure 1:
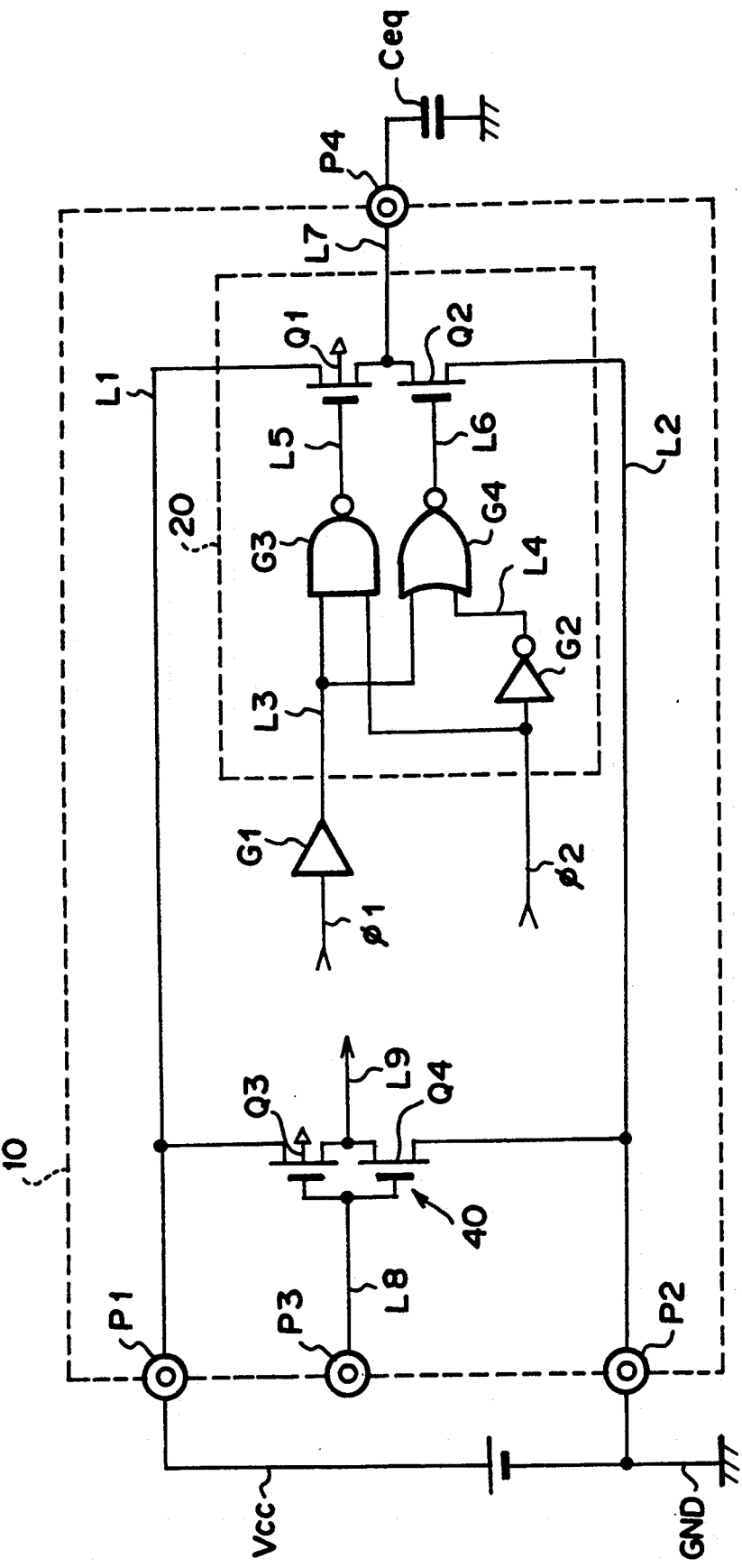
FIG. 1 shows a circuit diagram of a conventional semiconductor memory device having an output data buffer circuit.

Throughout the following description, similar reference numerals refer to similar elements in all figures of the drawings.

FIG. 1 shows an example of a conventional semiconductor device which is especially realized as a semiconductor memory device 10. The semiconductor memory device 10 comprises therein a data output buffer circuit 20 which drives an external circuit represented by an equivalent capacitance Ceq. The data output buffer circuit 20 comprises a pair of complementary MOSFETs Q1, Q2 connected in series, an inverter G2, a two-input NAND gate G3 and a two-input NOR gate G4. A signal $\phi 1$ is a data which is read out from internal storage cells in the semiconductor memory device 10. The data $\phi 1$, after having been pre-amplified to an appropriate level by a buffer G1, is inputted to either one of the two inputs of each of the NAND gate G3 and the NOR gate G4. The signal $\phi 2$ is an output control signal which is produced by an internal circuit in the semiconductor memory device 10. The output control signal $\phi 2$ is directly inputted to the other input of the NAND gate G3 and is also inputted to the other input of the NOR gate G4 through the inverter G2. The output of each of the NAND gate G3 and the NOR gate G4 is applied to each gate of the MOSFETs Q1 and Q2. The MOSFET Q1 is of a P-channel depletion mode and the MOSFET Q2 is of an N-channel enhancement mode.

The circuit formed by a pair of complementary FETs Q3 and Q4 is an external signal input circuit 40 and is a ratio circuit. The FET Q3 is a P-channel depletion mode MOSFET whereas the FET Q4 is an N-channel enhancement mode MOSFET.

P1 is a power supply terminal, P2 is a ground terminal, P3 is an external signal input terminal, P4 is a signal output terminal, L1 through L9 are lines, Vcc is a power supply line and GND is a ground line. To the data output buffer circuit 20, a power supply potential and a ground potential are supplied from the power supply terminal P1 and the ground terminal P3 through the line L1 and the line L2, respectively. Supplying of a power supply potential and a ground potential to the external signal input circuit 40 is also effected from the respective terminals P1 and P2 through the respective lines L1 and L2. In other words, supplying of a power supply potential and supplying of a ground potential to the respective circuits, constituting the semiconductor device as a whole, are effected in parallel or commonly from the same terminals through the same lines.

Figure 2:
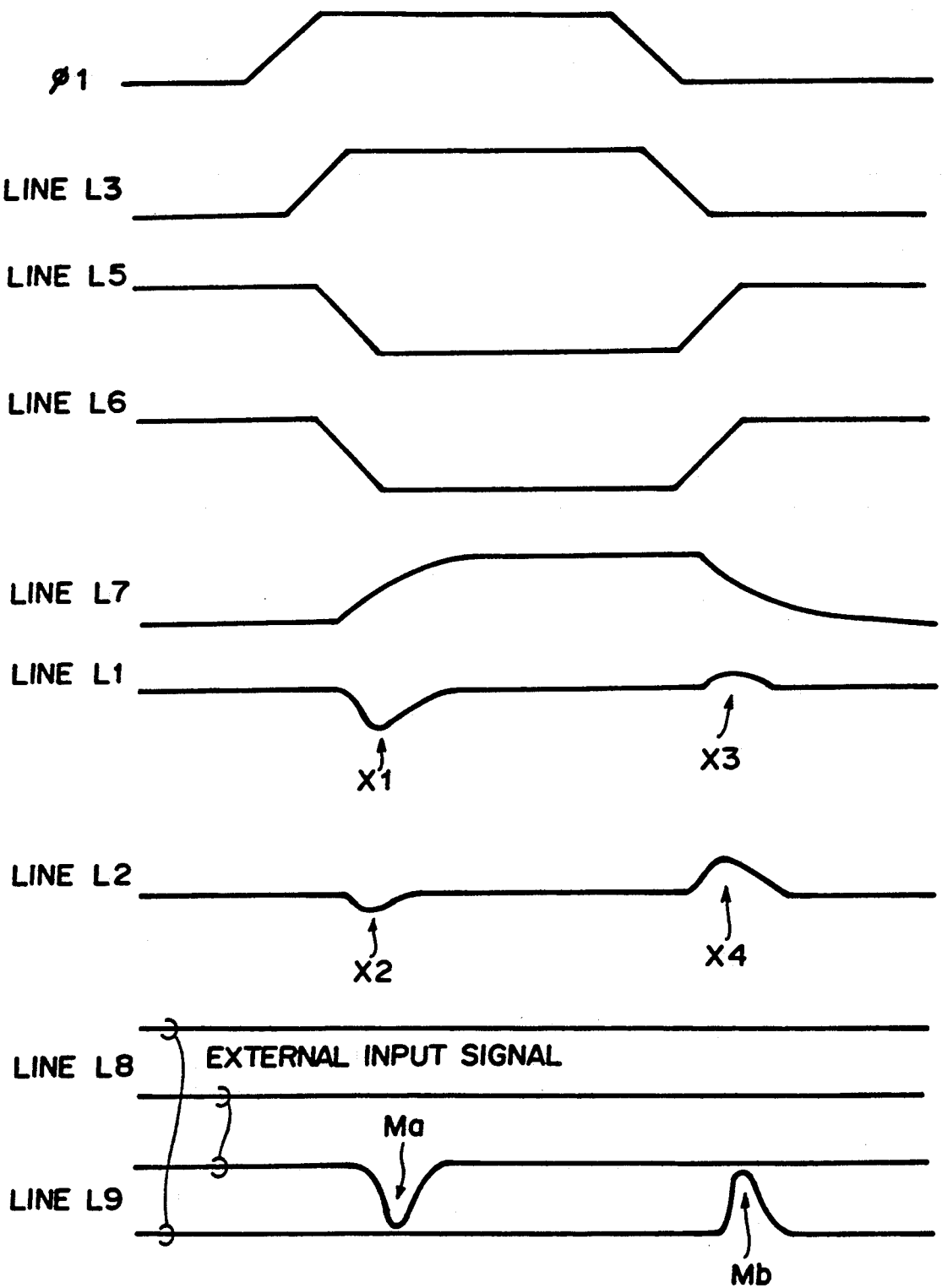
FIG. 2 shows wave forms of the respective signals at some principal portions or lines in the conventional circuit shown in FIG. 1.

FIG. 2 shows the respective wave forms taken at some principal points or lines in the circuit device of FIG. 1.

Now, referring to FIG. 2, the actual operations of the conventional semiconductor circuit device of FIG. 1 is hereinafter explained.

The data signal $\phi 1$ which is read out from the internal storage cells is once pre-amplified by the buffer G1 and is forwarded to the data output buffer circuit 20 which is controlled by the output control signal $\phi 2$ in the following manner. When the output control signal $\phi 2$ is at its low level (hereinafter expressed simply by "L"), the output terminal P4 assumes a high impedance thereby inhibiting the data outputting whereas, when the same signal $\phi 2$ is at its of high level (hereinafter expressed simply by "H"), the data is allowed to be outputted externally. When both the conditions wherein the output control signal $\phi 2$ is H and wherein the data signal $\phi 1$ is L are satisfied, the line L3 is L, the line L4 is L, the line L5 is H, the line L6 is H and, thus, the FET Q1 turns off and the FET Q2 turns on. Therefore, the line L7 which is connected through the external output terminal P4 to the external circuit represented by the equivalent capacitance Ceq is coupled to the ground line GND through the turned on FET Q2, the line L2 and the ground terminal P2, whereby the line 7 is rendered the ground potential. Here, if the data signal $\phi 1$ changes to H, the line L3 becomes H, the line L5 becomes L and the line L6 becomes L, so that the FET Q1 turns on and the FET Q2 turns off. Consequently, the current flows, through the power supply terminal P1, the line L1, the turned on FET Q1, the line L7 and the signal output terminal P4, to the external circuit represented by the equivalent capacitance Ceq. The capacitance Ceq of the external circuit is then charged up and the signal output terminal P4 becomes H. As explained hereinabove, it is under the control of the output control signal $\phi 2$ that the data signal $\phi 1$ is outputted to the external circuit through the data output buffer circuit 20.

As shown in FIG. 2, in the conventional semiconductor memory device 10 as described above, output noises X1, X3 or X2, X4 in the power supply potential at the line L1 or the ground potential at the line L2 which take place when the data is outputted from the data output buffer circuit 20 are unavoidably transmitted to other related circuits such as the external signal input circuit 40, thereby changing the input threshold voltages thereof. The noises are transmitted because both the power supply line Vcc and the ground line GND connected to the data output buffer circuit 20 are respectively used in common with those for such means as the external signal input circuit 40. The output noise X1 is a potential fluctuation on the power supply line, which is attendant on the H level data outputting, the noise X2 is a potential fluctuation on the ground line, which is attendant on the coupling to the power supply line, the noise X3 is a potential fluctuation on the power supply line, which is attendant on the coupling to the ground line, and the noise X4 is a potential fluctuation on the ground line, which is attendant on the L level data outputting.

It can be seen from FIG. 2 that, especially clearly from the potential diagram of the output line L9 of the external signal input circuit 40, the external signal input circuit 40 malfunctions due to the inversion of its input threshold voltage as shown by the points Ma and Mb along the potential diagram, caused by the output X1, X2 and X3, X4.

As compared with the conventional semiconductor memory device as explained above, the device according to the present invention is different in the point that is possible for the device to predict an occurrence of the output noises attendant on the data outputting operation of the data output buffer circuit 20 and in the point that it is possible to hold the output level of other related input circuits, for example, the external signal input circuit 40 based on the prediction of the possible output noises. The prediction of the possible output noises is achieved by the detection of the level changes in the data signal $\phi 1$ inputted to the data output buffer circuit 20 and in addition, if needed, by the detection of the level changes in the output control signal $\phi 2$. Thus, the device according to the present invention comprises an output detecting circuit which detects the level changes in the data signal $\phi 1$ inputted to the data output buffer circuit 20 and further, if needed, in the output control signal $\phi 2$, and a holding circuit which holds the output level of the related input circuits, for example, the external signal input circuit 40.

Now, some preferred embodiments of the semiconductor memory device according to the present invention will be explained in detail with reference to the drawings.

Figure 3:
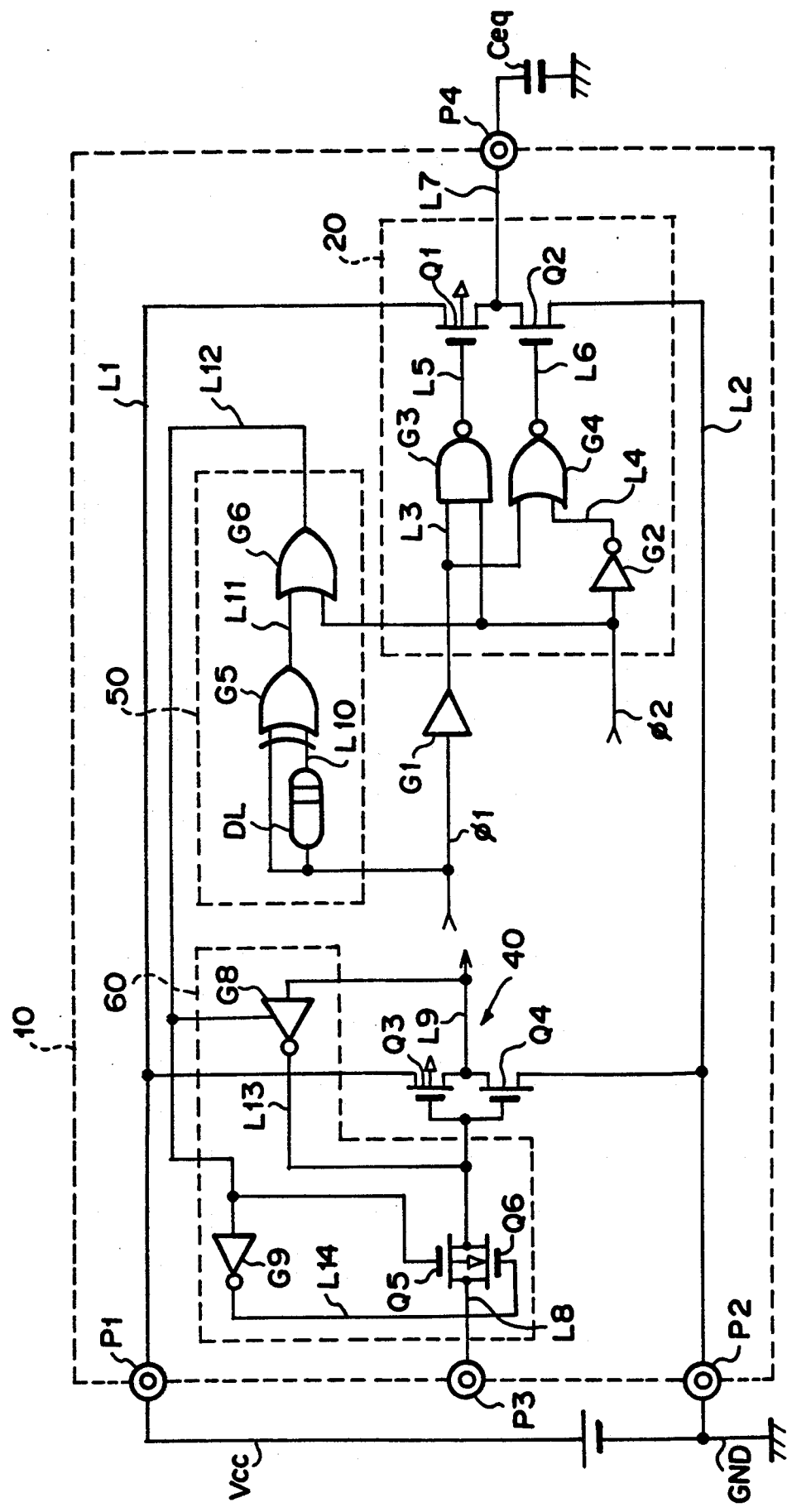
FIG. 3 shows a circuit diagram of the first embodiment of the present invention.

FIG. 3 shows a first embodiment of the present invention. In the explanation of the present embodiment, the same numerals or symbols as used in the conventional device of FIG. 1 are used for the same or like elements so that the repetition of the same descriptions may be exempted with.

The output detecting circuit, designated by the reference numeral 50 in FIG. 3, comprises a signal delay element DL having a delay time td, a two-input Exclusive OR gate G5 and a two-input OR gate G6. Specifically, the data signal $\phi 1$ is inputted directly to one input of the Exclusive OR gate G5 and inputted to the other input thereof through the signal delay element DL. The output of the Exclusive OR gate G5 is connected to one input of the OR gate G6, the other input of which receiving the output control signal $\phi 2$. The holding circuit designated by the reference numeral 60 comprises a tri-state buffer G8, an inverter G9, a P-channel depletion mode MOSFET Q5 and an N-channel enhancement mode MOSFET Q6. More specifically, the output of the output detecting circuit 50, that is, the output of the OR gate G6 is connected to the input of the inverter G9, the gate of FET Q5 and the enabling input of the tri-state buffer G8. The output of the inverter G9 is connected to the gate of the FET Q6. The MOSFETs Q5 and Q6 form a CMOS transfer gate circuit positioned between the external signal input terminal P3 and the external signal input circuit 40. The input of the tri-state buffer G8 is connected to the line L9 and the output thereof is connected to the gates of the FETs Q3 and Q4 constituting the external signal input circuit 40 of a ratio type. L10–L14 show respective lines.

Figure 4:
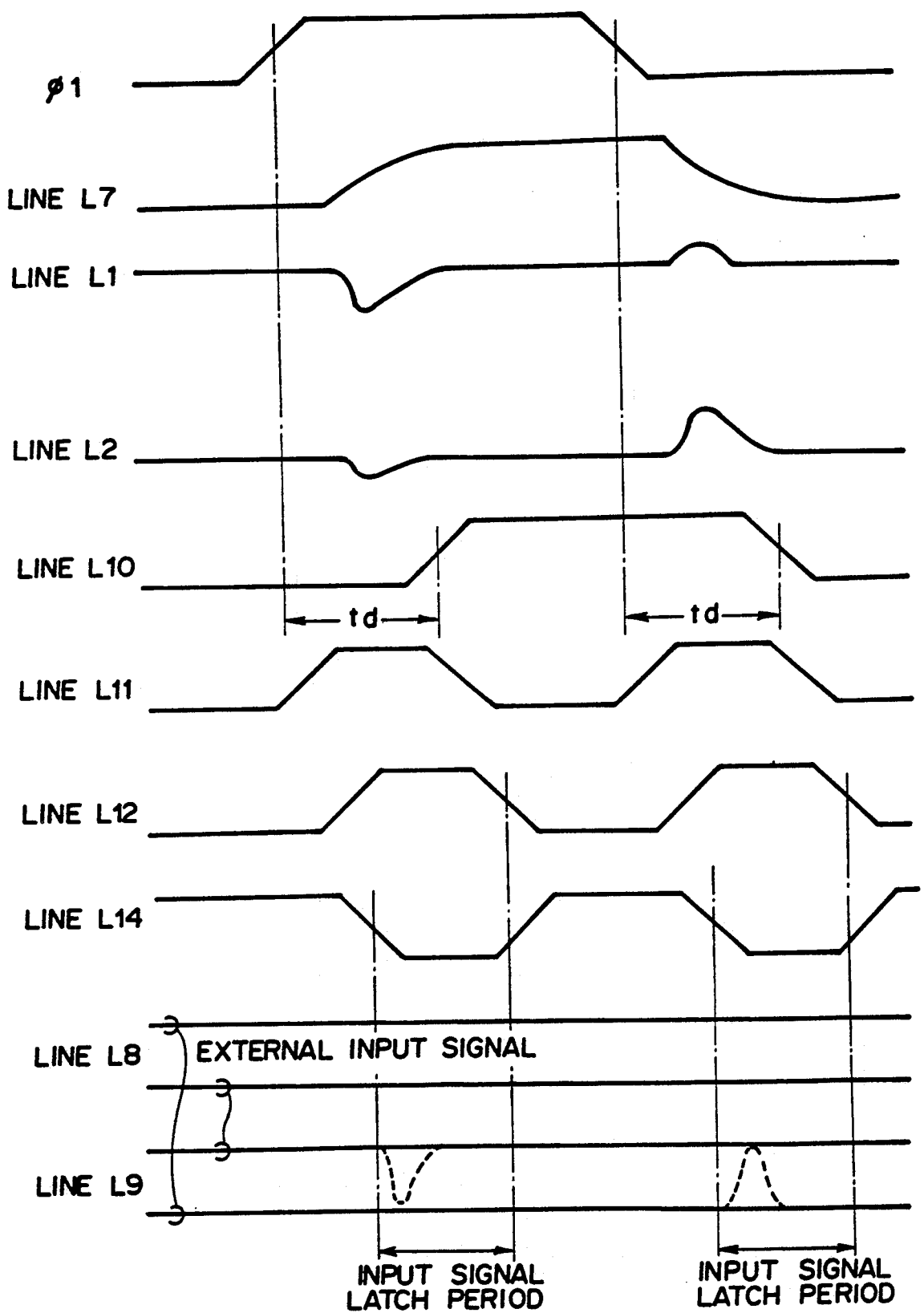
FIG. 4 shows wave forms of the respective signals at some principal portions or lines in the circuit shown in FIG. 3.

Next, the actual operations of the circuit of FIG. 3 is explained with reference to FIG. 4 which shows the respective wave forms taken at some principal points or lines in the circuit.

When the data signal φ1 is maintaining its L level, both the inputs of the Exclusive OR gate G5 are L, so that their output at the line L11 is L. When the data signal φ1 changes here to H, one of the two inputs of the Exclusive OR gate G5 to which the data signal φ1 is directly inputted immediately becomes H whereas the other of the two inputs changes to H with a delay of the time td which is set by the signal delay element DL, so that the line L11 becomes H in response to changes in the data signal φ1 and becomes L with a delay of the time td as set. That is, in accordance with the changes of the data signal φ1 from L to H, the Exclusive OR gate G5 outputs a signal of H for a predetermined time period (td), which is so called a one-shot pulse. Also, even when the data signal φ1 changes in the opposite direction, that is, from H to L, the Exclusive OR gate G5 outputs the same one-shot pulse. Therefore, the circuit constituted by the combination of the signal delay element DL and the Exclusive OR gate G5 detects the level changes of the data signal φ1 and outputs one-shot pulses of H.

The present embodiment realizes the output detecting circuit 50 in which the OR gate G6 takes a logic OR between the output signal from the circuit constituted by the combination of the signal delay element DL and the Exclusive OR gate G5 and the output control signal φ2 and which is able to detect not the changes in the data signal φ1 but the changes in the output control signal φ2.

In the present embodiment, the external signal input circuit 40 of a ratio circuit type, constituted by the pair of FETs Q3 and Q4, is capable of holding its output level by the holding circuit 60 in the following manner. That is, when an output detection is not being carried out by the output detecting circuit 50, the line L12 is L, so that the line L14 of the output of the inverter G9 is H and then the CMOS transfer gate constituted by the FETs Q5, Q6 is in its on state and the tri-state buffer G8 is not operating since an enabling signal applied thereto through the line L12 is L. Therefore, while an output detection is not being carried out, the external signal input circuit 40 of the present embodiment, having the holding circuit 60 as explained above, is in no way different in functions from the conventional one of FIG. 1.

On the other hand, when the line L12 becomes H due to the operation of the output detecting circuit 50, the line L14 becomes L only while the line L12 is H and then the CMOS transfer gate constituted by the FETs Q5, Q6 turns off, so that the external signal input circuit 40 no longer accepts a signal from the external signal input terminal P3. Further, the tri-state buffer G8 functions as an inverter since the enabling signal applied thereto through the line L12 becomes H. The tri-state buffer G8 and the FETs Q3, Q4 constitute a flip-flop circuit. That is, during the period in which the line L12 is H, the level of the line L9, namely, the output level of the external signal input circuit 40, is kept being held. Therefore, as clearly shown in FIG. 4, it is possible that, by the signal produced in the output detecting circuit 50, the output level of the external signal input circuit 40 of the ratio type is held during the period in which the data is being outputted to the external circuit, without being affected by the output noises X1, X2 and X3, X4.

It is to be noted that the holding circuit 60 which operates to hold the output level of the ratio circuit is not limited to the use in the above explained output signal input circuit 40 since it may be adopted in, for example, an amplifier circuit for amplifying a very low level signal in which a change in an input threshold voltage can be a cause for malfunctions.

Figure 5:
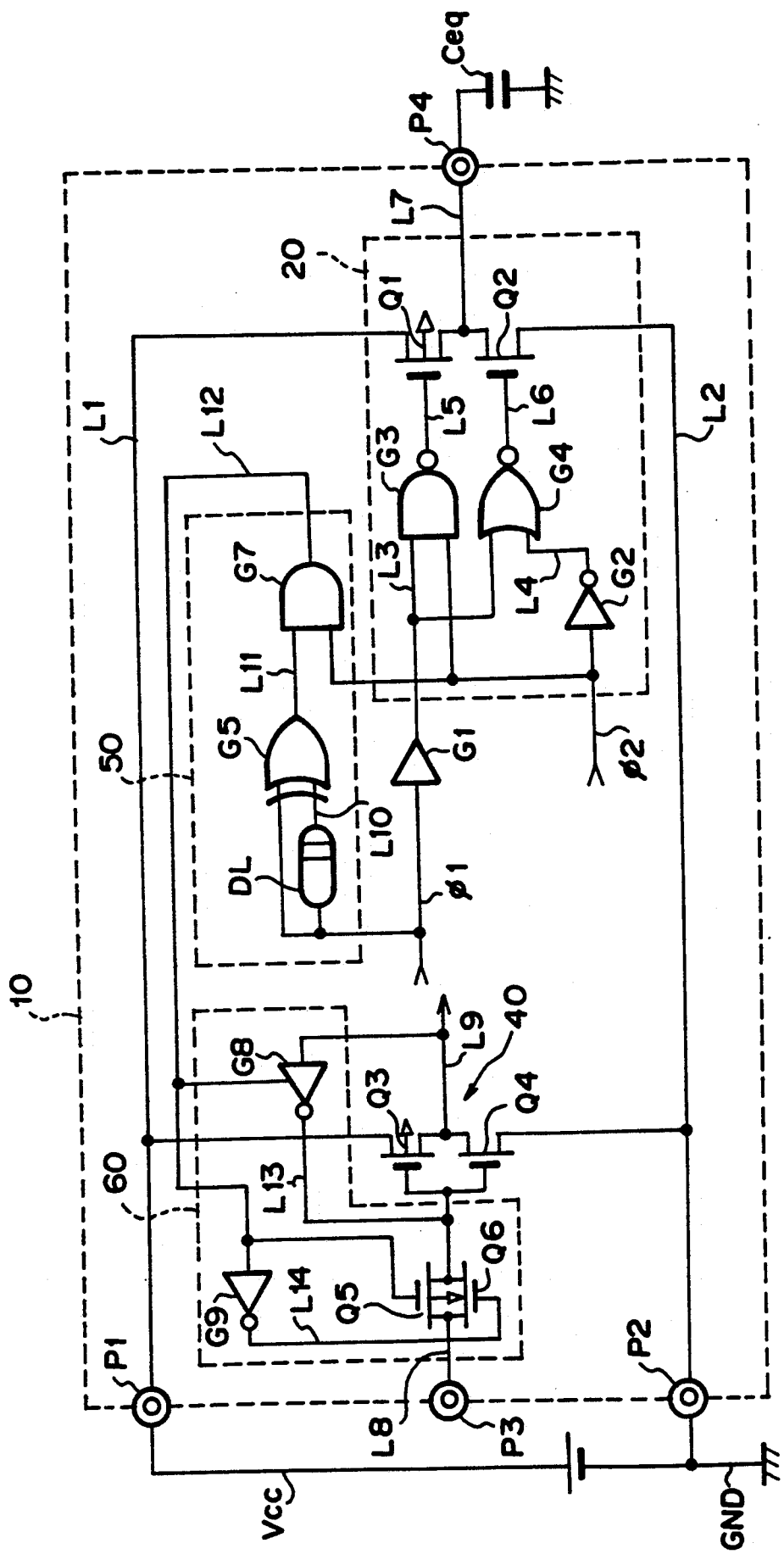
FIG. 5 shows a circuit diagram of another embodiment of the present invention.

FIG. 5 shows a second embodiment of the present invention. In this embodiment, the OR gate G6 in the first embodiment of FIG. 3 is replaced for a two-input AND gate G7 but the remaining arrangements are completely the same as those in the first embodiment. That is, the AND gate G7 takes a logical AND between the output signal from the circuit for detecting the level changes in the data signal φ1 and the output control signal φ2, whereby the output detecting circuit 50 produces an output signal which is applied to the holding circuit 60.

Therefore, in this second embodiment, only during the period in which the output control signal φ2 is H, the output detecting circuit 50 operates to output a signal in response to the level changes in the data signal φ1.

As explained above, the semiconductor device according to the present invention is advantageous in that, by detecting the level changes in the data signal inputted in the data output buffer circuit and additionally, if desired, by detecting the level changes in the output control signal, it is possible to eliminate the influence on any related input circuits from the output noises attendant on the data outputting operation of the data output buffer circuit.

Finally, although in the specific embodiments of the invention described herein, the respective FETs used have been specified as being N-channel type or P-channel type, it will be understood that either type may be utilized with appropriate changes being made in the polarities of the power supply sources or lines. Also, it will be understood that the embodiments of the invention shown and described are but illustrative and that various modifications may be made therein without departing from the scope and spirit of this invention.

What is claimed is:

1. A semiconductor device having a data output buffer circuit controlled by an output control signal, comprising:
    an output detecting circuit for detecting the level changes in the data signal inputted to said data output buffer circuit;
    a signal input circuit, an output level of which is determined on the basis of the detection of the level changes in the data signal by said output detecting circuit; and
    a holding circuit for holding said output level of said signal input circuit,
    whereby possible output noises attendant on the data outputting operation of said data output buffer circuit are prevented from affecting the operation of said signal input circuit.

2. A semiconductor device according to claim 1, in which said output detecting circuit comprises a signal delay element and an Exclusive OR gate constituting a detection circuit for detecting the level changes in the data signal read out from internal memory cells and an OR gate taking a logical OR between the output signal from said detection circuit and the output control signal, thereby detecting the level changes in the data signal and in the output control signal, both the data and output control signals inputted to the data output buffer circuit.

3. A semiconductor device according to claim 1, in which said output detecting circuit comprises a signal delay element and an Exclusive OR gate constituting a detection circuit for detecting the level changes in the data signal read out from internal memory cells and an AND gate taking a logical AND between the output signal from said detection circuit and the output control signal, thereby detecting the level changes in the data signal inputted to the data output buffer circuit while the output control signal is at its high level.

4. A semiconductor device according to claim 2 or 3, in which said detection circuit constituted by said signal delay element and said Exclusive OR gate outputs one-shot pulses in response to the level changes in the data signal.

5. A semiconductor device according to claim 1, in which said device includes a power supply line and a ground line, said data output buffer circuit comprising:
   a complementary set of first and second field effect transistors, each source of which being connected to the power supply line and the ground line, the drains of which being tied together and connected to a signal output terminal;
   an inverter receiving at its input said output control signal;
   a two-input NAND gate receiving at one input said data signal and at the other input said output control signal and outputting a signal to the gate of said first transistor; and
   a two-input NOR gate receiving at one input said data signal and at the other input said output control signal inverted by said inverter and outputting a signal to the gate of said second transistor.

6. A semiconductor device according to claim 5, in which said first field effect transistor is of a P-channel depletion mode and said second field effect transistor is of an N-channel enhancement mode.

7. A semiconductor device according to claim 5, in which said signal input circuit is a ratio circuit comprising a complementary set of third and fourth field effect transistors, the gates of said transistors being tied together and receiving said externally applied signal, the source of said third transistor being connected to the power supply line, the source of said fourth transistor being connected to the ground line, and the drains of said transistors being tied together and outputting an output signal.

8. A semiconductor device according to claim 7, in which said third field effect transistor is of a P-channel depletion mode and said fourth field effect transistor is of an N-channel enhancement mode.

9. A semiconductor device according to claim 7, in which said holding circuit comprises:
   a tri-state buffer having an input, an output and an enabling signal input, said input and output being connected between the output and the input of said signal input circuit constituted by said third and fourth field effect transistors and said enabling signal input being connected to the output of said output detecting circuit;
   a transfer gate circuit having a set of fifth and sixth field effect transistors, disposed between the external signal input terminal and the input of said signal input circuit, the gate of said fifth transistor connected to the output of said output detecting circuit;
   an inverter, an input of which is connected to the output of said output detecting circuit and an output of which is connected to the gate of said sixth transistor.

10. A semiconductor device according to claim 9, in which said fifth field effect transistor is of a P-channel depletion mode and said sixth field effect transistor is of an N-channel enhancement mode.

11. A semiconductor device according to claim 9, in which said tri-state buffer and said third and fourth transistors constitute a flip-flop circuit.

* * * * *

UNITED STATES PATENT AND TRADEMARK OFFICE
CERTIFICATE OF CORRECTION

PATENT NO. : 5,005,156
DATED : April 2, 1991
INVENTOR(S) : Yasuhiro TAKAI

It is certified that error appears in the above-identified patent and that said Letters Patent is hereby corrected as shown below:

Col. 3, line 21, delete "of";

Col. 4, line 6, after "output" insert --noises--.

Signed and Sealed this

Fifteenth Day of September, 1992

Attest:

DOUGLAS B. COMER

*Attesting Officer*      *Acting Commissioner of Patents and Trademarks*